US010790785B2

United States Patent
Chen et al.

(10) Patent No.: US 10,790,785 B2
(45) Date of Patent: Sep. 29, 2020

(54) CIRCUIT STRUCTURE TO GENERATE BACK-GATE VOLTAGE BIAS FOR AMPLIFIER CIRCUIT, AND RELATED METHOD

(71) Applicant: GLOBALFOUNDRIES INC., Grand Cayman (KY)

(72) Inventors: Yiching Chen, San Jose, CA (US); Thomas G. Mckay, Boulder Creek, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 4 days.

(21) Appl. No.: 16/240,923

(22) Filed: Jan. 7, 2019

(65) Prior Publication Data

US 2020/0220499 A1    Jul. 9, 2020

(51) Int. Cl.
| | | |
|---|---|---|
| *H03F 1/02* | (2006.01) | |
| *H03F 3/195* | (2006.01) | |
| *H03F 3/21* | (2006.01) | |
| *H03G 3/30* | (2006.01) | |
| *H03F 3/213* | (2006.01) | |

(52) U.S. Cl.
CPC ........... *H03F 1/0216* (2013.01); *H03F 3/195* (2013.01); *H03F 3/213* (2013.01); *H03G 3/3042* (2013.01); *H03F 2200/18* (2013.01); *H03F 2200/451* (2013.01)

(58) Field of Classification Search
USPC ......................................... 330/250, 277, 311
See application file for complete search history.

(56) References Cited

U.S. PATENT DOCUMENTS

| | | | |
|---|---|---|---|
| 7,525,381 B2 * | 4/2009 | Murden | H03F 3/45242 330/253 |
| 2018/0138881 A1 | 5/2018 | Long et al. | |
| 2018/0167038 A1 * | 6/2018 | Lee | H03F 1/523 |

OTHER PUBLICATIONS

Woo et al., "Dynamic Stack-Controlled CMOS RF Power Amplifier for Wideband Envelope Tracking," IEEE Transactions on Microwave Theory and Techniques, vol. 62, No. 12, Dec. 2014, 13 pages.
Anonymous, "Introducing the 22FDX 22nm FD-SOI Platform from Globalfoundries," Mar. 2016, 13 pages.

* cited by examiner

*Primary Examiner* — Hieu P Nguyen
(74) *Attorney, Agent, or Firm* — David Cain; Hoffman Warnick LLC

(57) ABSTRACT

Embodiments of the present disclosure provide a circuit structure. An error amplifier of the structure includes an input terminal coupled to a voltage source, a reference terminal, and an output terminal coupled to a back-gate terminal of a power amplifier. A voltage at the output terminal of the error amplifier indicates a voltage difference between the input terminal and the reference terminal. A logarithmic current source may be coupled to the reference terminal of the error amplifier, the logarithmic current being configured to generate a reference current logarithmically proportionate to a voltage level of the voltage source. A plurality of serially coupled transistor cells, having a shared substrate and coupled between the reference terminal of the error amplifier and ground, each may include a back-gate terminal coupled to the output terminal of the error amplifier.

20 Claims, 10 Drawing Sheets

Reference Current ($I_{REF}$) v. Input Voltage ($V_{IN}$)

Power ratio and voltage v. Reference current

CIRCUIT STRUCTURE TO GENERATE BACK-GATE VOLTAGE BIAS FOR AMPLIFIER CIRCUIT, AND RELATED METHOD

TECHNICAL FIELD

Embodiments of the disclosure relate generally to circuit structures, and more particularly, to circuit structures and methods for generating a back-gate voltage bias for one or more amplifier circuits. The various embodiments described herein can be used in a variety of applications, e.g., signal transmission circuits of wirelessly networked hardware.

BACKGROUND

In electrical hardware, a transistor is a critical component for implementing digital and analog circuitry designs. Generally, a transistor includes three electrical terminals: a source, a drain, and a gate. By applying different voltages to the gate terminal, the flow of electric current between the source terminal and the drain terminal of the transistor can be switched on or off. The presence or absence of an applied voltage at the gate terminal of a transistor can be identified as "on" and "off" states of the transistor. Thus, transistors can serve as a switching element in various circuit designs, e.g., by manipulating a voltage applied to the gate of each transistor and thereby affecting the flow of electrical current between source and drain terminals of each transistor. These attributes cause a transistor to be a fundamental component in power amplification circuitry, e.g., RF amplifiers, oscillators, filters, etc. During operation, transistors in an amplifier circuit can have fixed direct current (DC) voltages applied to their gate, source, and/or drain terminals while an alternating current (AC) voltage to be amplified is applied to one or more terminals in addition to the fixed DC voltage.

Transistor design and placement can influence the electrical behavior of interconnected elements in an electronic circuit. The use of multiple interconnected devices over a wide area, colloquially known as "internet of things" or "IOT," is a rapidly growing area of electronics engineering. Each interconnected device in an IOT arrangement can include one or more power amplifiers to provide signal transmission and reception with respect to other devices in the same network. Each device can be structured to operate with reduced power consumption until signals are transmitted or received, e.g., using an antenna-transceiver assembly. Activating power amplifier circuits for signal transmission, known in the art as a power ramping operation, has an associated transition time, i.e., power ramping time profile. Stabilizing the power ramping in a power ramping operation of an amplifier is a technical challenge.

In the context of IOT systems, power amplifier output may need to change depending on the reception at a given time, thereby requiring substantial power control flexibility during operation. Past attempts to meet these requirements for power ramping time profile and power control have involved costly and complex additions to circuit hardware, e.g., adding additional chips, logic components, look-up tables, etc. In some cases, maintaining a desired power ramping profile may require active components such as transistors to continuously monitor and adjust the voltages applied to various portions of an amplifier circuit. Conventional technology does not offer an intuitive mechanism for continuously monitoring and adjusting the resistance across amplifier transistors without using substantial device space and operating power to maintain a desired power ramping profile for transient operation.

SUMMARY

A first aspect of the present disclosure provides a circuit structure including: an error amplifier having: an input terminal coupled to a voltage source, a reference terminal, and an output terminal coupled to a back-gate terminal of a power amplifier, wherein a voltage at the output terminal of the error amplifier indicates a voltage difference between the input terminal and the reference terminal; a logarithmic current source coupled to the reference terminal of the error amplifier, wherein the logarithmic current is configured to generate a reference current logarithmically proportionate to a voltage level of the voltage source; and a plurality of serially coupled transistor cells having a shared substrate and coupled between the reference terminal of the error amplifier and ground, wherein each of the serially coupled transistor cells includes a back-gate terminal coupled to the output terminal of the error amplifier.

A second aspect of the present disclosure provides a circuit structure including: an error amplifier having: an input terminal coupled to a voltage source, a reference terminal, and an output terminal coupled to a back-gate terminal of a power amplifier, wherein a voltage at the output terminal of the error amplifier indicates a voltage difference between the input terminal and the reference terminal; a logarithmic current source having an output coupled to the reference terminal of the error amplifier, wherein the logarithmic current is configured to generate a reference current logarithmically proportionate to a voltage level of the voltage source; and a power cell chain having an input terminal coupled to the reference terminal of the error amplifier and the output from the logarithmic current source, and an output terminal coupled to ground, the power cell chain including: a dopant-implanted substrate, the dopant-implanted substrate defining a back-gate region, the back-gate region being coupled to the output terminal of the error amplifier; a buried insulator layer positioned on the dopant-implanted substrate, a fully-depleted semiconductor-on-insulator (FDSOI) substrate positioned on the buried insulator layer, wherein the buried insulator layer separates the FDSOI layer from the back-gate region, and a plurality of serially-connected transistors each formed within the FDSOI layer and each including a source region, a channel region, and a drain region, and a gate region electrically coupled to the source region.

A third aspect of the present disclosure provides a method including: transmitting a reference current to a reference terminal of an error amplifier, the reference current being logarithmically proportionate to a voltage coupled to an input terminal of the error amplifier, wherein the voltage is equal to an input voltage of a voltage source; transmitting an output from the error amplifier to a plurality of serially coupled transistor cells at respective back-gate terminals thereof, the plurality of serially coupled transistor cells receiving the reference current to define a voltage at the reference terminal of the error amplifier; and applying the output to a back-gate terminal of an amplifier transistor during the transmitting of the reference current and the output from the error amplifier, to continuously adjust an internal resistance of the power amplifier between input and output terminals thereof.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
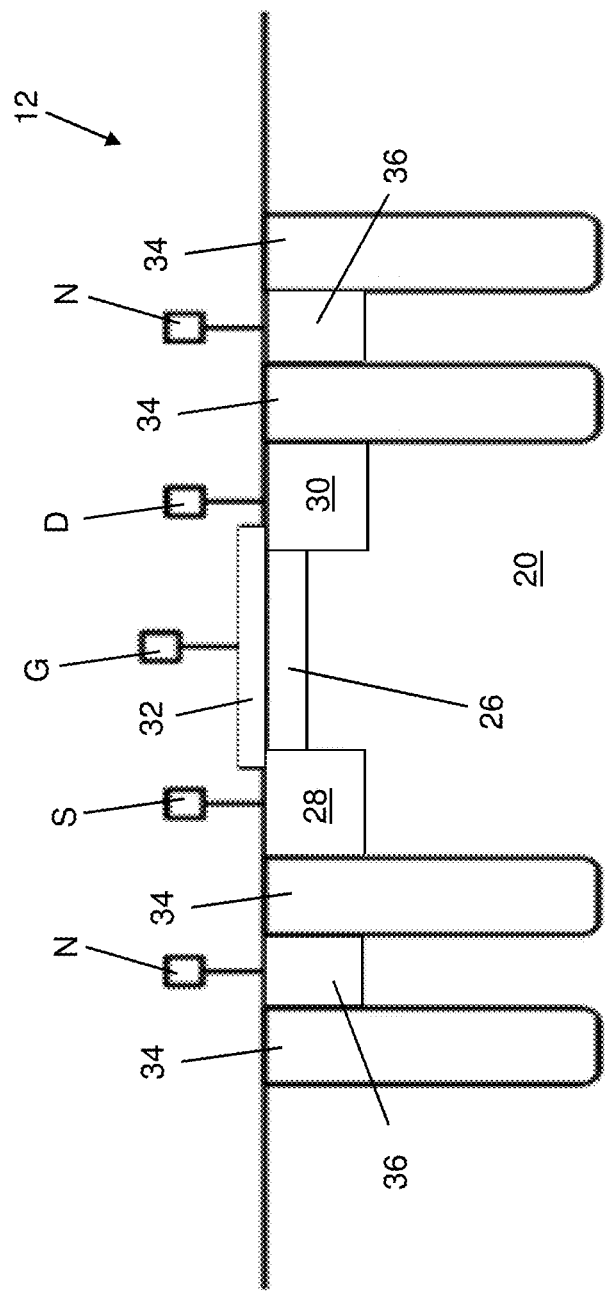
FIG. 1 shows a cross-sectional view of a conventional transistor structure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure relate to circuit structures and methods for continuously adjusting the properties of an amplifier by way of back-gate voltage bias in the amplifier. More specifically, the disclosure provides circuit structures and related methods for passive closed-loop control of back-gate voltage applied to an amplifier. Embodiments of the disclosure include a separate error amplifier and logarithmic current source for continuously adjusting back-gate bias levels for transient operation. As discussed herein, a "forward bias" generally refers to a voltage bias (e.g., a positive polarity voltage) at which the potential barrier (threshold voltage "$V_{th}$") at a p-n or metal-semiconductor junction (such as that within the body of a transistor) is lowered, and large current is allowed to flow from one region to another. A "reverse bias" generally refers to a voltage bias (e.g., a negative polarity voltage) at which the potential barrier ($V_{th}$) at the p-n or metal-semiconductor junction is increased and current flow from one region to another is restricted. Applying forward and reverse biasing voltages to back-gate regions can allow a user to control the resistance or impedance across a transistor. Controlling the resistance across the source and drain of a transistor affects ramping time between dormant and active modes of an amplifier, and circuit power ramping to meet a predetermined time profile. To conserve space and reduce the total number of components, embodiments of the disclosed circuit may include structural and operational differences relative to conventional amplifier circuits and/or conventional transistors. Continuously and passively adjusting the voltage bias to back-gate regions of amplifier transistors, according to the present disclosure, may provide robust and efficient control over power output from an amplifier circuit, resistance across the amplifier circuit in transient operation, and/or may provide other technical benefits not specifically discussed herein.

Referring to FIG. 1, a conventional transistor 12 is depicted as an example to emphasize structural and operational differences relative to embodiments of the present disclosure, and transistor elements included therein. Conventional transistor 12 may be fabricated, e.g., by way of conventional fabrication techniques which may operate on a bulk silicon substrate. Conventional transistor 12 thus may be formed in a substrate 20 including, e.g., one or more semiconductor materials. Substrate 20 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 20 or a portion thereof may be strained.

Source and drain nodes S, D of conventional transistor 12 may be coupled to regions of substrate 20 which include conductive dopants therein, e.g., a source region 28 and a drain region 30 separated by a channel region 26. A gate region 32 formed on channel region 26 can be coupled to a gate node G to control the formation of a conductive channel within channel region 26. A group of trench isolations 34 may be formed from electrically insulating materials such that regions 26, 28, 30 are laterally separated from parts of other transistors. As shown, trench isolations 34 form an insulating barrier between terminals 36 and regions 26, 28, 30 and/or other elements. Further features of each element in conventional transistor 12 (e.g., function and material composition) are described in detail elsewhere herein relative to similar components in an FDSOI transistor 102 (FIG. 2).

Figure 2:
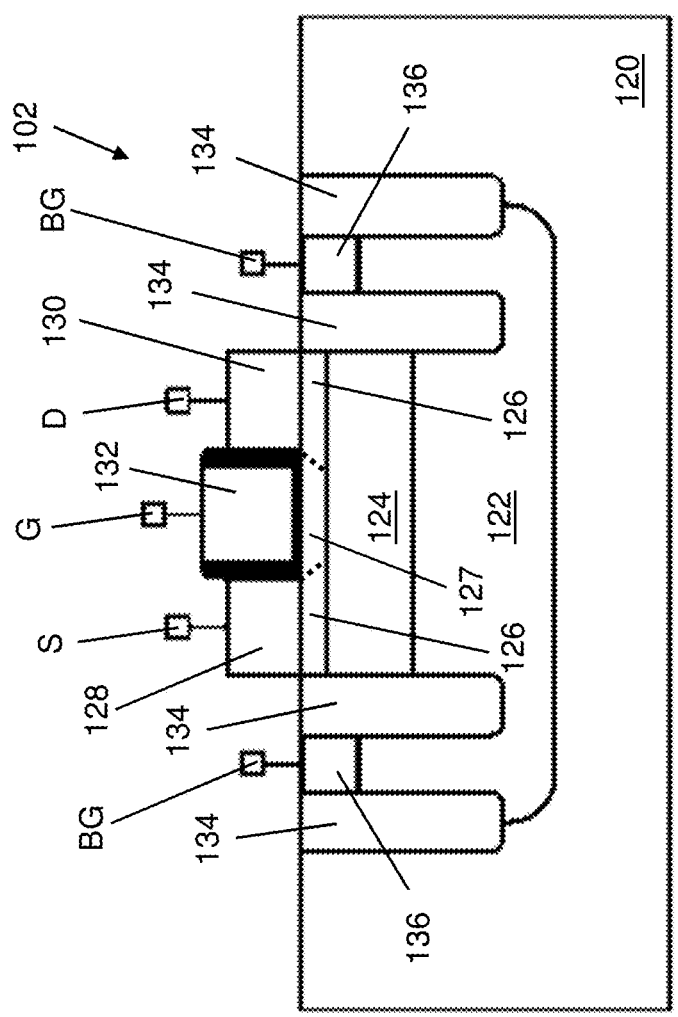
FIG. 2 shows a cross-sectional view of a transistor structure with a back-gate region beneath a buried insulator layer according to embodiments of the disclosure.

Turning to FIG. 2, a cross-sectional view of an FDSOI transistor 102, which may be deployed, e.g., in structures and methods according to the disclosure, is shown. FDSOI transistor 102 can be formed with structural features for reducing the electrical resistance across source and drain terminals S, D thereof. FDSOI transistor 102 and components thereof can be formed on and within a substrate 120. Substrate 120 can include any currently known or later-developed semiconductor material including, without limitation, one or more of the example semiconductor materials described elsewhere herein relative to substrate 20 (FIG. 1). A back-gate region 122, alternatively identified as an n-type or p-typed doped well region, of substrate 120 can be implanted with one or more doping compounds to change the electrical properties thereof. Doping generally refers to a process by which foreign materials ("dopants") are added to a semiconductor structure to alter its electrical properties, e.g., resistivity and/or conductivity. Where a particular type of doping (e.g., p-type or n-type) doping is discussed herein, it is understood that an opposite doping type may be implemented in alternative embodiments. Implantation refers to a process in which ions are accelerated toward a solid surface to penetrate the solid up to a predetermined range based on the energy of the implanted ions. Thus, back-gate region 122 can include the same material composition as the remainder of substrate 120, but can additionally include dopant materials therein. A buried insulator layer 124, also known in the art as a "buried oxide" or "BOX" layer, can separate back-gate region 122 of substrate 120 from source/drain regions 126 and a channel region 127 of FDSOI transistor 102. Buried insulator layer 124 therefore may be composed of one or more oxide compounds, and/or any other currently known or later-developed electrically insulative substances. FDSOI transistor 102 therefore can be embodied as a "fully-depleted semiconductor on insulator" (FDSOI) structure, distinguishable from other structures (e.g., conventional transistor 12 (FIG. 1)) by including buried insulator layer 124, back-gate nodes BG, etc., thereby allowing technical advantages such as an adjustable electric potential within back-gate region 122 of FDSOI transistor 102 as discussed elsewhere herein.

Source/drain regions 126 and channel region 127 may electrically couple a source terminal 128 of FDSOI transistor 102 to a drain terminal 130 of FDSOI transistor 102 when transistor is in on state. A gate stack 132 can be positioned over channel region 127, such that a voltage of gate node G controls the electrical conductivity between source and drain terminals 128, 130 through source/drain regions 126 and channel region 127. Gate stack 132 can have, e.g., one or more electrically conductive metals therein, in addition to a gate dielectric material (indicated with black shading between bottom of stack and channel region 127) for separating the conductive metal(s) of gate stack 132 from at least channel region 127. A group of trench isolations 134, in addition, can electrically and physically separate the various regions of FDSOI transistor 102 from parts of other transistors. Trench isolations 134 may be composed of any insulating material such as $SiO_2$ or a "high-k" dielectric having a high dielectric constant, which may be, for example, above 3.9. In some situations, trench isolations 134 may be composed of an oxide substance. Materials appropriate for the composition of trench isolations 134 may include, for example, silicon dioxide ($SiO_2$), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later-developed materials having similar properties.

Back-gate region 122 can be electrically coupled to back-gate node BG through back-gate terminals 136 within substrate 120 to further influence the characteristics of FDSOI transistor 102, e.g., the conductivity between source and drain terminals 128, 130 through source/drain regions 126 and channel region 127. Applying an electrical potential to back-gate terminals 136 at back-gate node BG can induce an electric charge within back-gate region 122, thereby creating a difference in electrical potential between back-gate region 122 and source/drain regions 126, channel region 127, across buried insulator layer 124. Among other effects, this difference in electrical potential between back-gate region 122 and source/drain regions 126, channel region 127, of substrate 120 can affect the threshold voltage of FDSOI transistor 102, i.e., the minimum voltage for inducing electrical conductivity across source/drain and channel regions 126, 127 between source and drain terminals 128, 130, as discussed herein. In particular, applying a back-gate biasing voltage to back-gate terminals 136 can lower the threshold voltage of FDSOI transistor 102, thereby reducing source drain resistance and increasing drain current, relative to the threshold voltage of FDSOI transistor 102 when an opposite voltage bias is applied to back-gate terminals 136. This ability of FDSOI transistor 102, among other things, can allow a reduced width (saving silicon area) relative to conventional applications and transistor structures. In an example embodiment, a width of source/drain and channel regions 126, 127 (i.e., into and out of the plane of the page) can be between approximately 0.3 micrometers (μm) and approximately 2.4 μm. A length of source/drain and channel regions 126, 127 (i.e., left to right within the plane of the page) between source and drain terminals 128, 130 can be, e.g., approximately twenty nanometers (nm). FDSOI technology transistors, e.g., FDSOI transistor 102, offer the ability to apply a voltage bias to back-gate region 122 to manipulate the threshold voltage $V_t$ (i.e., minimum voltage for channel formation) of FDSOI transistor 102. As described herein, back-gate region 122 can allow a user to manipulate ramp power amplifier output to meet a predetermined time profile. Back-gate region 122 can alternatively be used to set a power output to a precise value, e.g., to offer improved power control.

Figure 3:
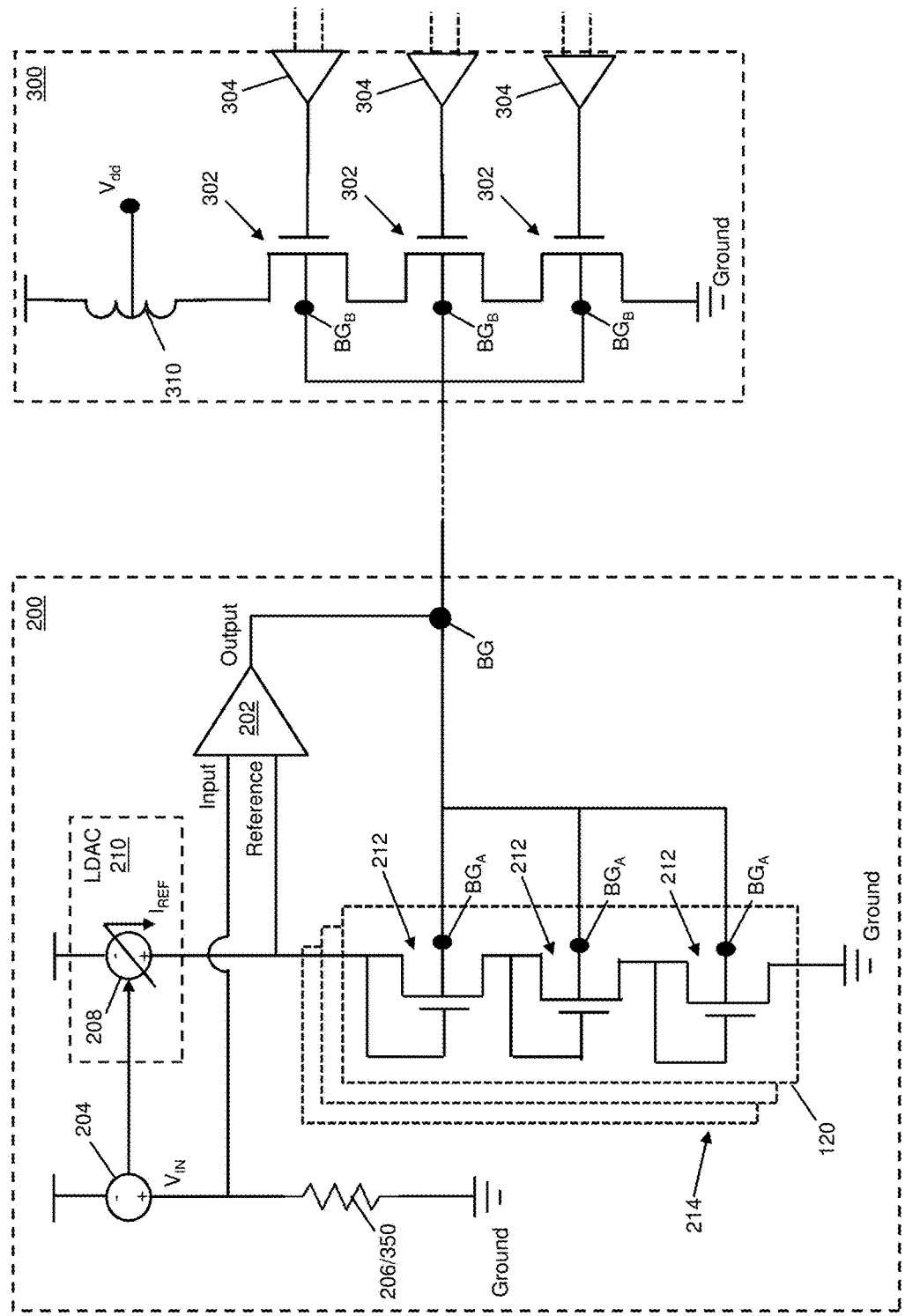
FIG. 3 shows a schematic view of a circuit structure according to embodiments of the disclosure.

Turning to FIG. 3, a circuit structure (simply "circuit" hereafter) 200 allows a user to continuously adjust the resistance across an interconnected transistor, e.g., an amplifier transistor, during operation. The technical advantages and features described herein can be attainable by using embodiments of FDSOI transistor 102 (FIG. 2) for each transistor element of circuit 200, and by forming each transistor element in a shared substrate (e.g., one substrate 120) as discussed herein. Circuit 200 may include various features for passive control over back-gate voltage biases applied to amplifier transistors. Embodiments of circuit 200 are configured to continuously adjust source-drain resistance across the amplifier via closed loop control features of circuit 200. In this context, closed loop control refers to the process of amplifying a voltage differential between input and reference voltages in circuit 200 to create an amplified output, applying the amplified output to back-gate terminals of transistor cells within circuit 200 to modify the reference voltage, and thereby adjust the amplified output via the reference voltage.

Circuit 200 includes an error amplifier 202 with two input terminals (labeled as "input" and "reference") and one output terminal (labeled as "output"). Error amplifier 202 may be provided as any currently known or later developed circuit configuration for accepting a differential input voltage (i.e., two amplifier inputs) to generate an output voltage indicative of the difference between the two inputs. An error amplifier generally refers to an element configured to multiply the difference between the two inputs as an output voltage for transmission to other components. Error amplifier 202 may include an operational amplifier independently coupled to a dedicated power supply and including various capacitors, resistors, etc., though such sub-components are omitted from FIG. 3 for ease of illustration.

The input terminal of error amplifier 202 may be electrically coupled to a voltage source 204 e.g., a dedicated power supply for circuit 200 and/or a power source configured to generate power for an interconnected device. Voltage source 204 may include one or more batteries and/or other conventional power sources capable of providing a direct current (DC) voltage to circuit 200. The DC voltage supplied to circuit 200 is denoted as "$V_{IN}$." Voltage source 204 may be adjustable between a linear range of possible voltages, e.g., between a negative voltage of 5.0 volts (V), a zero voltage, a maximum voltage of +5.0 V, various intermediate voltages (e.g., −4.0 V, −1.5 V, +1.0 V, +2.75 V, etc.). In such cases, voltage source 204 may be adjustable directly or with the aid of various currently known or later-developed test components (e.g., adjustable resistors, etc.). Voltage source 204 may be linearly electrically coupled to a load resistor 206 positioned between voltage source 204 and ground, such that the input terminal to error amplifier 202 is coupled at a node between voltage source 204 and load resistor 206. Load resistor 206 may be included within, or otherwise be replaced with, a device 350 (e.g., a radio frequency (RF) signal processing circuit) interconnected with circuit 200 and various amplifiers as discussed elsewhere herein.

The reference terminal of error amplifier 202 may be electrically coupled to a logarithmic current source 208. Logarithmic current source 208 may be interconnected with voltage source 204, e.g., through intervening logic circuitry, one or more amplifiers, etc., such that logarithmic current source generates a reference current ($I_{REF}$) logarithmically proportionate to voltage level ($V_{IN}$) of voltage source 204. In an example embodiment, the reference current generated from logarithmic current source 208 may be expressed as a static current gain multiplied by a logarithmic function of $V_{IN}$. Under this arrangement, changing the value of $V_{IN}$ according to a linear profile will cause $I_{REF}$ to change along a logarithmic profile, i.e., increasing along a profile with an initially high slope, which gradually decreases to zero. The characteristics of a logarithmic profile are discussed in further detail herein relative to FIG. 6. Logarithmic current source 208 may include, in some embodiments, a logarithmic digital to analogue converter (LDAC) coupled to voltage source 204 and configured to generate $I_{REF}$ as an output by way of digital circuitry for defining a logarithmic current profile. In any case, the output terminal of logarithmic current source 208 may be coupled to the reference input terminal of error amplifier 202, in addition to a plurality of serially coupled transistor cells 212.

Circuit 200 may include plurality of serially coupled transistor cells ("cells" hereafter) 212 each formed within and sharing substrate 120. Three cells 212 are shown as being formed in shared substrate 120, but different numbers of cells 212 may be provided in different embodiments. Regardless of the number of cells 212, a power cell chain 214 may include each of the various cells 212, and their respective terminals (i.e., source, drain, channel, gate, and back-gate) in a single shared substrate 120. Further embodiments, for example, may include five cells, ten cells, twenty cells, etc., in any conceivable number between logarithmic current source 208 and ground. Each cell 212 may be embodied as an FDSOI transistor, e.g., FDSOI transistor 102 (FIG. 2). According to one example, the terminals of each cell may define a diode-connected transistor, i.e., a transistor having an interconnected gate and drain terminal. Diode-connected transistors may electrically bias current flow from logarithmic current source 208 to ground, as shown in the schematic of FIG. 3.

An electrical resistance across cells 212, and current emitted from logarithmic current source 208, may define a voltage at the reference terminal to error amplifier 202, e.g., via Ohm's law. The electrical resistance across cells 212 may be at least partially dependent on an amount of back-gate voltage bias applied to each cell 212 at a respective back-gate node $BG_A$. Where the voltage level $V_{IN}$ of voltage source 204 remains constant, reference current $I_{REF}$ will also remain constant. Each cell 212 may include a back-gate terminal having a respective back-gate voltage applied at terminal $BG_A$ during operation. As shown, back-gate terminal $BG_A$ for each cell 212 is electrically coupled to the output from error amplifier 202. Supplying input voltage $V_{IN}$ from voltage source 204 to error amplifier 202 will define the back-gate voltage applied to each cell 212, thereby also defining the resistance across cells 212. In this manner, continued operation of circuit 200 creates a closed loop in which the output from error amplifier 202 will affect the resistance across cells 212, thereby adjusting the reference voltage applied to error amplifier 202.

As discussed, circuit 200 may use error amplifier 202, voltage source 204, logarithmic current source 208, and cells 212 to continuously adjust a voltage at back-gate node coupled to the output from error amplifier 202. The various operational features of circuit 200 may be configured to supply a forward or reverse back-gate voltage bias to portions of an amplifier circuit 300 (simply "amplifier" hereafter). Amplifier 300 in particular may include multiple amplifier transistors 302 configured to have an adjustable back-gate voltage bias. In some cases, each amplifier transistor 302 of circuit 300 may include an embodiment of FDSOI transistor 102 (FIG. 2). Amplifier 300 may convert an input signal into an amplified output signal. A "power amplifier" or "electronic amplifier," e.g., amplifier 300, may be defined as an electronic circuit or sub-circuit for increasing amplitude of an input signal without fundamentally changing the shape of the signal.

Amplifier 300 may include multiple transistors for controlling the passage of electrical current therethrough, and in a general example may include multiple amplifier transistors 302 each having respective source nodes, drain nodes, gate nodes, and back-gate nodes ($BG_B$) at respective positions. Each node of amplifier transistor(s) 302 may be formed through the example structure of FDSOI transistor 102, e.g., as described herein relative to FIG. 2. Back-gate nodes $BG_B$ of each amplifier transistor 302 may be coupled in parallel to node BG of circuit 200. In this way, the output from amplifier transistor 202 will define the back-gate voltage applied to each amplifier transistor 302. Circuit 200 is structured to include a closed loop for controlling the back-gate voltage applied to amplifier 300 as voltage source 204 supplies a constant voltage to error amplifier 202.

Although circuit 200 provides a forward or reverse back-gate voltage bias from the output of error amplifier 202, amplifier 300 may otherwise operate independently of circuit 200. As shown, each amplifier transistor 302 may receive a respective signal or portion of a signal to be amplified. A group of preamplifier (PPA) circuits 304 each may be coupled to the gate terminal of one amplifier transistor 302 in amplifier 300. A preamplifier circuit generally refers to an electrical component which converts an input signal into a stronger output signal, e.g., with sufficient gain to accommodate variances from noise or interference in subsequent processing. To this extent, the output of each PPA circuit 304 can be electrically coupled to the gate of one amplifier transistor 302 to control or otherwise influence the electrical operation of amplifier 300. More specifically, PPA circuits 304 can influence whether electrical signals will pass through or be blocked by channel regions (e.g., channel region 127 (FIG. 2)) within amplifier transistor(s) 302 as circuit 200 and amplifier 300 operate. In the generalized example of FIG. 3, amplifier 300 may include an amplifier load 310 (represented by example as an inductor, e.g., for a transformer) coupled to the source of one amplifier transistor 302. The drain of another amplifier transistor 302 may be connected to ground, as shown. In this arrangement, signals from PPA circuits 304 may enter amplifier transistors to be amplified at load 310. During this process, circuit 200 will continuously adjust the back-gate voltage of amplifier transistors 302 to control the resistance across each amplifier transistor 302, and thus the power amplification through amplifier 300.

Figure 4:
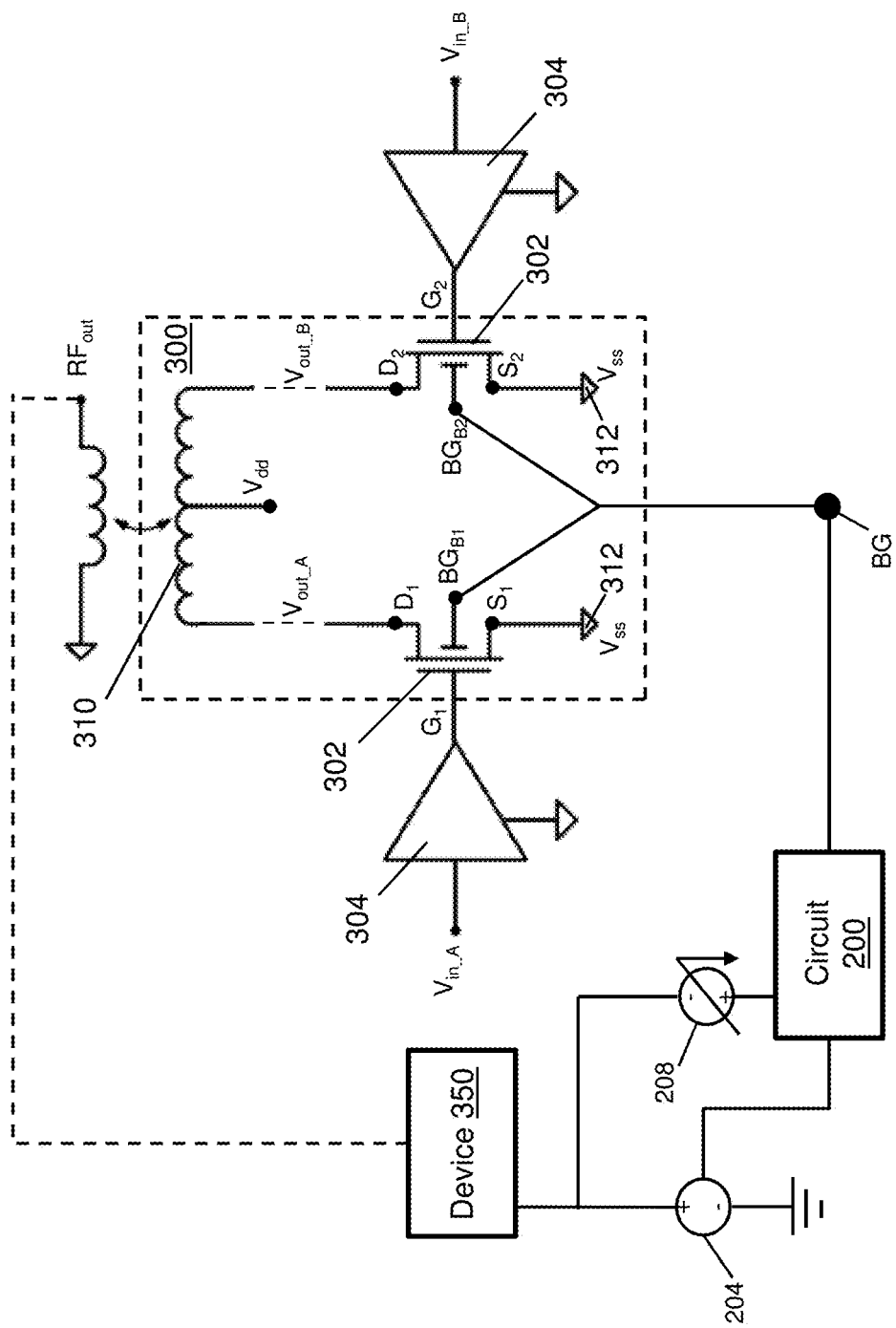
FIG. 4 shows a schematic view of an amplifier circuit interconnected with a device and circuit structure according to embodiments of the disclosure.

Proceeding to FIGS. 3 and 4, a system configuration including circuit 200 electrically coupled to amplifier 300 and a device 350 is shown according to further embodiments of the disclosure. Although circuit 200 is shown in a simplified representation in FIG. 4, it is understood that circuit 200 includes the various sub-components shown in FIG. 3 and discussed elsewhere herein. In the example of FIG. 4, device 350 may be an RF signal processing circuit coupled to voltage source 204 in parallel with circuit 200. To transmit RF signals to device 350, amplifier 300 may take the form of an RF amplifier configured to amplify differential signals for transmission to device 350. Here, amplifier 300 may convert a differential input signal ($V_{in\_A}$ and $V_{in\_B}$) to respective outputs ($V_{out\_A}$, $V_{out\_B}$). In addition, amplifier load 310 may include a transformer configured to transform differential outputs $V_{out\_A}$, $V_{out\_B}$ to a single ended power amplifier output, $RF_{out}$. A "transformer" generally refers to an electrical device, which transfers electrical energy between two circuits through electromagnetic induction, e.g., to increase or decrease alternating current (AC) voltages by a desired factor while inversely affecting the magnitude of the output current. Transformers thus may be a fundamental element in the structure of amplifier 300 for producing a magnified RF signal amplitude. As shown, a fixed voltage ($V_{ss}$) for amplifier 300 can be electrically coupled at voltage supply node 312 to source terminals $S_1$, $S_2$ of amplifier transistors 302. PPA circuits 304 can each be electrically coupled to gate nodes G1, G2 of amplifier transistors 302 to produce differential output voltages $V_{out\_A}$, $V_{out\_B}$ based on input signals $V_{in\_A}$, $V_{in\_B}$ to PPA circuits 304. A supply voltage ($V_{dd}$) can also be applied to the transformer of load 310 within amplifier 300, as shown. During operation, amplifier 300 may amplify differential input voltages $V_{in\_A}$, $V_{in\_B}$ to produce amplified differential output voltages $V_{out\_A}$, $V_{out\_B}$ by a predetermined factor, also known as a "power ratio." In some cases, supply voltage $V_{dd}$ may be the same voltage provided to circuit 200 (e.g., at voltage source 204), and may also be the voltage supply to device 350. Embodiments of the disclosure can stabilize amplifier 300 by reducing the resistance of amplifier transistors 302 as transistor 300 transitions between dormant and active operation as described herein.

As noted elsewhere herein, conventional amplifier circuits may have limited stability when transitioning between transition between dormant and active (alternatively, "non-transmission" and "signal transmission") modes, e.g., due to the fixed resistance between source and drain terminals in a conventional transistor structure (e.g., transistors 12 (FIG. 1)). Embodiments of the present disclosure overcome this shortcoming by including coupling circuit 200 to the back-gate terminals of amplifier transistors 302 to continuously and passively adjust source/drain resistance through amplifier 300. When control over the resistance of amplifier transistors 302 is desired, voltage source 204 may transmit a fixed voltage to error amplifier 302 (FIG. 3) to produce a forward or reverse voltage bias as back-gate node BG. Applying the forward or reverse voltage bias to amplifier 300 in this manner may reduce the ramping time between dormant and active operating modes of amplifier 300. To further control the bias voltage, voltage source 204 may be linearly adjustable between a negative value (e.g., approximately −4.0 V) (low power) and a positive value (high or full power) (e.g., approximately 3.0 V)). It is understood that the voltage values can vary to suit different devices and/or operating situations. To this extent, circuit 200 may offer a varied range of power control by automatically supplying a back-gate bias to amplifier transistors 302 at different voltage ranges, e.g., low power voltage of approximately −4.0 V to high power voltage of approximately 4.0 V, as well as intermediate voltages. Embodiments of circuit 200 may be further distinct from conventional amplifier biasing devices by being structured such that reference current $I_{REF}$ of circuit 200 logarithmically depends on the selected voltage level of voltage source 204, thereby creating a distinct form of closed loop control using error amplifier 202, and without active monitoring and/or control components.

Figure 5:
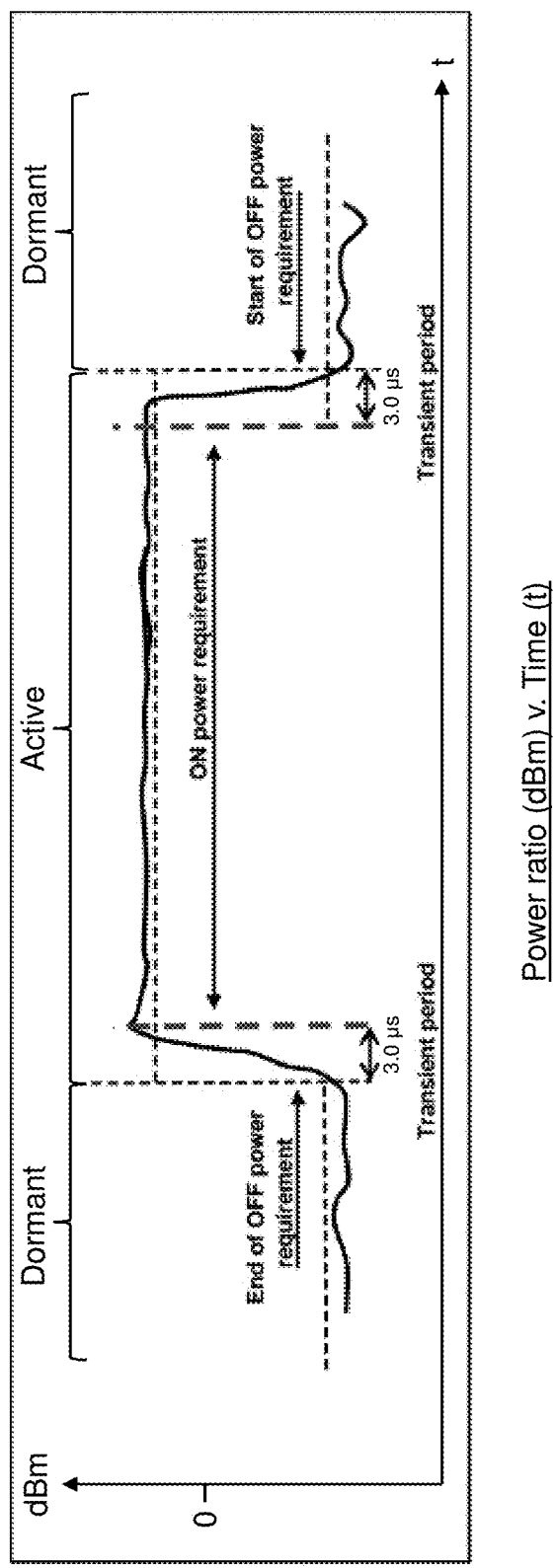
FIG. 5 shows a representative plot of voltage versus time during power ramping operation according to embodiments of the disclosure.

Referring to FIGS. 4-5 together, an example of the ratio of power output (e.g., $V_{out\_A}$, $V_{out\_B}$ at differential outputs to $V_{in\_A}$, $V_{in\_B}$ at differential inputs), e.g., in decibel-milliwatts (dBm), for amplifier 300 is plotted against time in seconds (s) to illustrate different operating modes. When circuit 200 does not need to aid amplifier 300 (e.g., signals are not being transmitted and received), the operation of circuit 200 and related structures (e.g., one or more devices 350 as described herein) may continue with a reduced use of power. A dormant operating mode is shown in FIG. 5 with beginning and ending time segments, and corresponding to a power ratio of less than zero. Despite being identified as a "dormant" operating mode, circuit 200 and device 350 may continue to operate, but without producing amplified signals from PA circuit 202. When amplifier 300 begins operating in an active mode (e.g., signal transmission or receipt begins), circuit 200 can be switched on to provide a forward or reverse voltage bias to the back-gate terminal of amplifier transistors 302. The time period between operation in dormant and active modes can be known as a ramping time or, alternatively, a transition time or delay.

The operational stability shown in FIG. 5 can be attained by applying forward or reverse biases from circuit 200 to amplifier 300, e.g., at back-gate nodes $BG_1$, $BG_2$ of amplifier transistors 302 during operation. In conventional arrangements, the transient period between dormant and active operation may be at least thirty microseconds (μs). Using circuit 200 to apply forward and reverse voltage biases to back-gate nodes $BG_1$, $BG_2$ in amplifier 300 can produce a continuously sloped change in power ratio between dormant and active modes, as compared to conventional structures, which produce an initial step in power ratio followed by a slower, non-continuous increase or decrease in power ratio between operating modes. The sharp reduction in transient time stems from alternately applying forward and reverse voltage biases to back-gate terminals of amplifier transistor 302 (FIG. 4), each of which may include FDSOI back-gate regions shown in FIG. 2 and/or equivalent structures. As shown, power ratio and voltage can transition between dormant and active operating modes along a continuously sloped profile, i.e., a power transition curve that is not piecewise defined. More specifically, applying a forward or reverse voltage bias to back-gate regions 122 (FIG. 2) of amplifier transistors 302 can prevent the power ratio and output voltage from remaining at a single value for more than approximately 0.1 µs. By contrast, conventional amplification systems may exhibit a power ramping profile in which voltage and/or power ratio remain at a constant value for one or more microseconds before beginning to slope upward or downward at a later time. Applying forward and reverse biases to back-gate regions of transistors in an amplifier circuit, as discussed herein, thereby produces a continuously sloped power ramping profile between operation in dormant and active operating modes.

Figure 6:
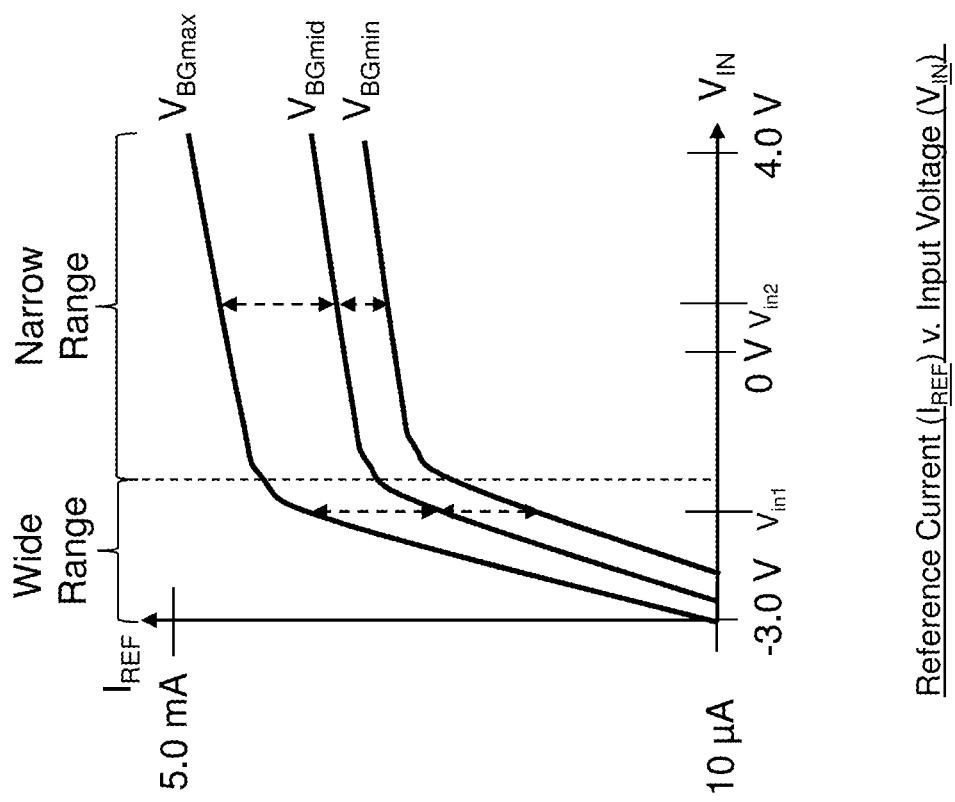
FIG. 6 shows a representative plot of a linear input voltage profile and logarithmic reference current profile according to embodiments of the disclosure.

Referring now to FIGS. 3 and 6 together, a plot of reference current $I_{REF}$ versus input voltage $V_{IN}$ is shown to demonstrate control and/or calibration of circuit 200. It is understood that a higher magnitude reference current $I_{REF}$ correlates to a higher back-gate voltage at the output of error amplifier 202, per Ohm's Law. Three curves are shown to indicate current and voltage at different amounts of back-gate voltage bias, e.g., a minimum back-gate voltage bias ($V_{BGmin}$), a median back-gate voltage bias ($V_{BGmed}$), and a maximum back-gate voltage bias ($V_{BGmax}$). Before or during the operation of circuit 200, it may be possible to select or adjust voltage source 202 to output one of several fixed DC voltages. In the example of FIG. 6, voltage source 202 may be adjustable linearly between approximately −3.0 V and approximately +4.0 V. Adjusting $V_{IN}$ to different levels may affect the sensitivity of $I_{REF}$ to different back-gate voltage biases. The logarithmic current profile of logarithmic current source in particular will cause a higher amount of sensitivity at higher-magnitude reverse biases, and much lower sensitivity and higher-magnitude forward biases. The different amounts of sensitivity are separately noted in FIG. 6 as being a "wide range" region and a "narrow range" region of the current-voltage profile. Where a higher amount of control is desired, current source 204 may be set to a negative voltage of high magnitude, thereby causing high variation between reference currents and associated back-gate biases. Where a lower amount of control is needed, voltage source 204 may be set to a positive voltage of high magnitude, thereby causing relatively low variation between reference currents and associated back-gate biases. The input voltage from voltage source 204 may be tested and selected before operation, and/or may be updated, adjusted, etc., midway through the operation of amplifier 300.

Figure 7:
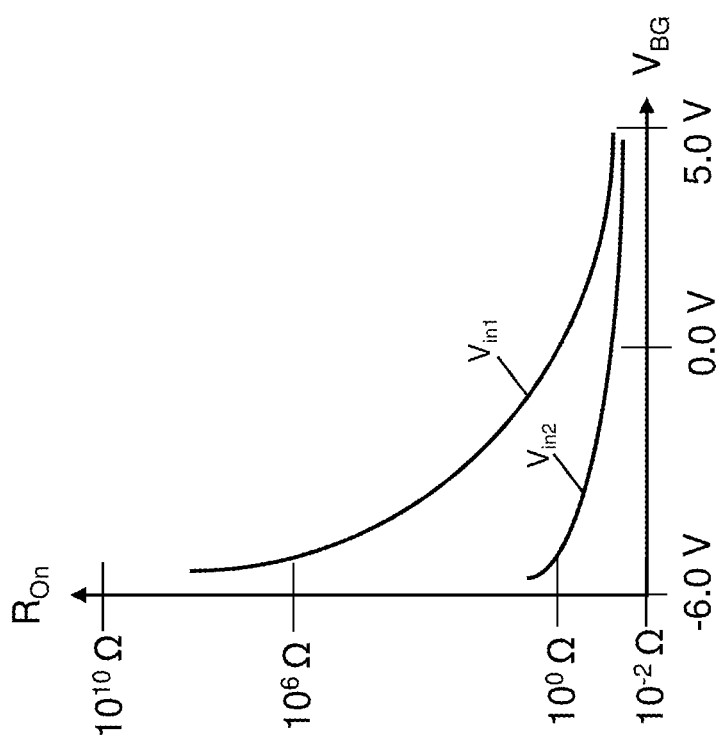
FIG. 7 shows a representative plot of amplifier power ratio versus resistance across an amplifier transistor according to embodiments of the disclosure.

FIG. 7 provides an example plot of amplifier resistance ($R_{on}$) versus back-gate voltage bias ($V_{BG}$) for two different input voltages shown in the plot of FIG. 6: $V_{in1}$, $V_{in2}$. The example of plot of FIG. 7 demonstrates how adjusting the back-gate voltage bias $V_{BG}$ at two different input voltages may yield substantially different ranges of amplifier resistance. Over a back-gate bias voltage range of −6.0 V to 5.0 V, amplifier resistance $R_{on}$ of each amplifier transistor may be adjustable between approximately $10^8 \Omega$ and approximately $10^{-2} \Omega$. Conversely, at a higher input voltage $V_{in2}$, amplifier resistance may exhibit an exponentially smaller range of adjustability, e.g., between approximately $10^0 \Omega$ and approximately $10^{-2} \Omega$. In some cases, negative and/or positive input voltages of higher magnitude may further increase the disparity of the example curves shown in FIG. 7.

Figure 8:
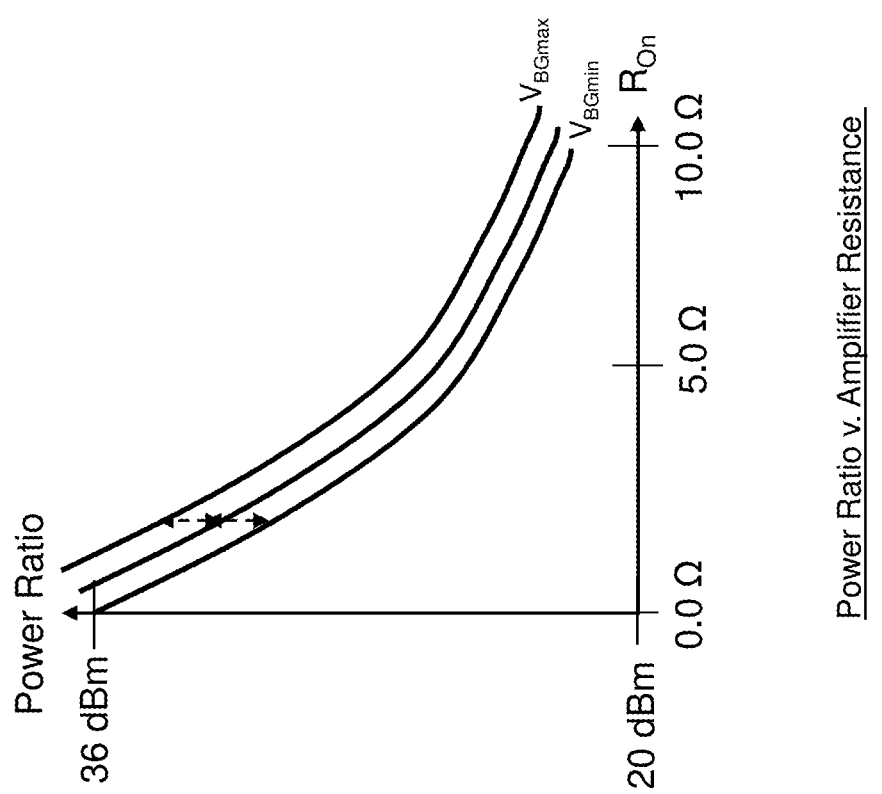
FIG. 8 shows a representative plot of amplifier resistance versus back-gate voltage for two input voltages according to embodiments of the disclosure.

Referring briefly to FIGS. 3 and 8, continuously adjusting the back gate voltage of amplifier transistors 302 may have significant effects on the power ratio of amplifier 300, without significantly changing the slope of the resulting power curve profile. FIG. 7 provides a representative plot of power ratio for amplifier 300 versus the resistance across amplifier transistor(s) 302 ($R_{on}$). As shown, a higher amplifier resistance has an approximately inverse-exponential correlation to power ratio in dBm, regardless of whether a low back-gate bias voltage or a high back-gate bias voltage is applied. However, higher back-gate bias voltages will yield a higher power output from amplifier 300 as compared to lower back-gate bias voltages in the example plot of FIG. 8. Thus, continuously adjusting back-gate bias voltage $V_{BG}$ may automatically improve the power ratio and related performance of amplifier 300, in addition to continuously adjusting the resistance $R_{on}$ across amplifier transistor 302.

Figure 9:
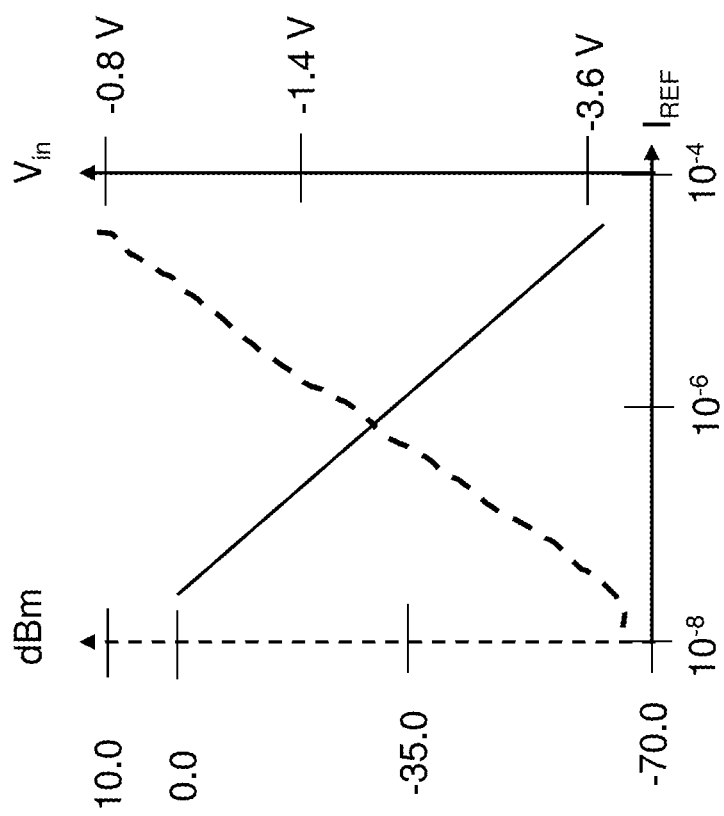
FIG. 9 shows a representative plot of power ratio and input voltage versus reference current while testing a range of input voltages in embodiments of the disclosure.

FIG. 9 provides an example plot of power ratio and reference current for amplifier 300 for a particular range of input voltages. The plot shown in FIG. 9 depicts an operation of amplifier 300 as input voltage $V_{IN}$ is adjusted across a range of possible input voltages. In the specific example of FIG. 9, $V_{IN}$ is adjusted between a range of approximately −3.6 V and approximately −0.4 V, but it is understood that positive voltages and/or a range of positive and negative voltages may be used in alternative examples. In this case, the resulting power ratio for amplifier 300 may have a negative magnitude. According to an example, a range of input voltages to circuit 200 may cause varying effects during the operation of amplifier 300. As the magnitude of negative input voltage $V_{IN}$ increases, the power ratio of amplifier 300 may substantially linearly change from an initial value of 0.0 dBm to approximately −70.0 dBm for an input voltage of approximately −3.6 V. Over the same voltage interval, reference current $I_{Ref}$ exhibits an inverse-logarithmic profile from approximately $10^{-8}$ A at a voltage of approximately −0.8 V, to approximately $10^{-4}$ A at a voltage of approximately −3.6 V. In the example of FIG. 9, an operator may vary input voltage $V_{IN}$ to circuit 200 to measure corresponding changes in gate bias voltage $V_{BG}$, and reference current $I_{Ref}$, to determine a desired performance level (e.g., power ratio in dBm) for a particular amplifier. It is thus understood that different test values for input voltage $V_{IN}$ may be applicable to different embodiments of circuit 200 and/or different amplifiers 300.

Figure 10:
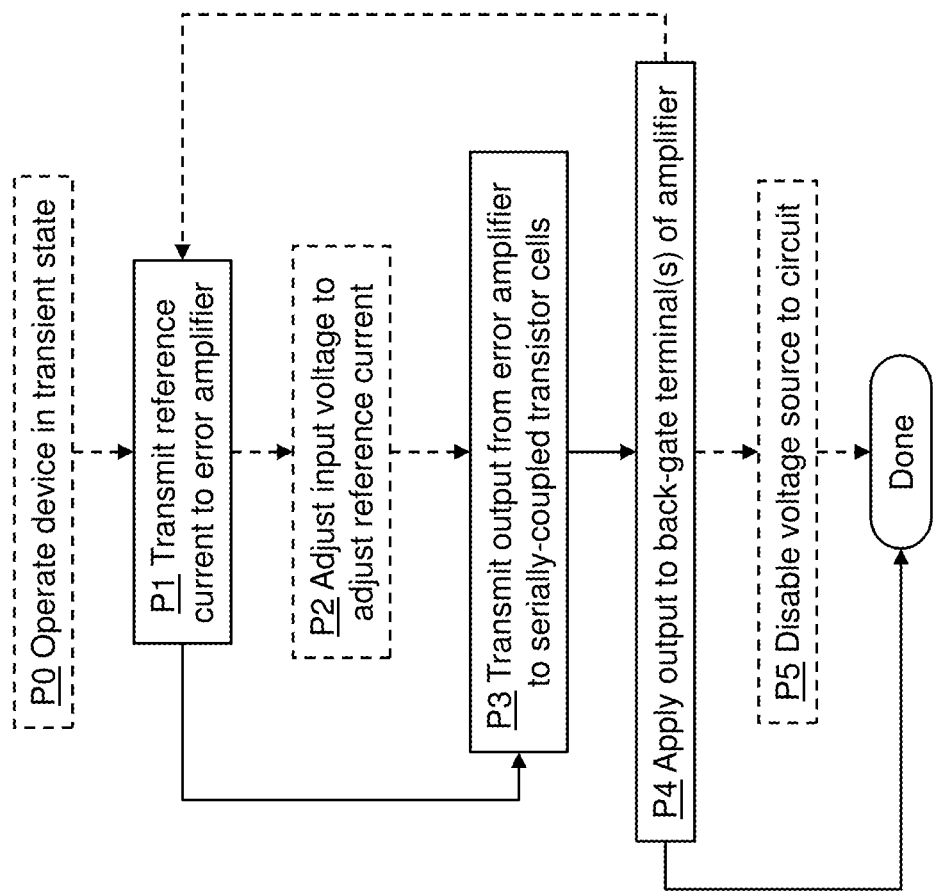
FIG. 10 shows an illustrative flow diagram of a method for providing a back-gate bias for power amplification according to embodiments of the disclosure.

Referring to FIGS. 3 and 10 together, embodiments of the disclosure include methods for adjusting power amplification in a circuit structure, e.g., through the operation of circuit 200 (e.g., embodiments shown in FIGS. 3, 4) described herein. Methods according to the disclosure may include, e.g., causing amplifier 300 to operate in a transient state in process P0 by shifting device 350 (FIG. 4) between a dormant and active operating mode. Transient state operation may require device 350 to undergo "power ramping," i.e., transitioning between high and lower power ratios as shown in the FIG. 5 plot. Process P0 may include applying an initial voltage input through voltage source 204. Applying the initial voltage input through voltage source 204 thereby may create reference current $I_{REF}$ and a corresponding output voltage at back-gate node BG in circuit 200.

After device 350 begins operating in a transient state, process P1 according to the disclosure may include transmitting reference current $I_{REF}$ to error amplifier 202. As noted elsewhere herein, logarithmic current source 208 may generate reference current $I_{REF}$ as a logarithmic function of input voltage $V_{IN}$ from voltage source 204. The transmitted reference current $I_{REF}$ thus may be defined on a logarithmic curve, e.g., the plot of reference current v. input voltage, shown in FIG. 6. The reference current $I_{REF}$ magnitude transmitted in process P1 thus may depend on the input voltage $V_{IN}$ of circuit 200. As noted elsewhere herein, the input voltage $V_{IN}$ magnitude may offer of a relatively wide or narrower range of power ramping control.

In some embodiments, e.g., calibration of circuit 200, methods of the disclosure may include using voltage source 204 to configure the range of possible reference current $I_{REF}$ magnitudes. In this case, the method may optionally include process P2 (shown in phantom) of adjusting input voltage $V_{IN}$ of voltage source 204 according to a linear profile, thereby adjusting reference current $I_{REF}$ from logarithmic current source 208 along a logarithmic profile. As demonstrated in the FIG. 6 plot, different input voltages from voltage source 204 may provide a wider or narrower range of back-gate voltage biases produced from error amplifier 202. In an example embodiment, input voltage $V_{IN}$ of voltage source 204 may be adjustable over a linear profile between, e.g., a lower limit of −3.0 V and an upper limit of +4.0V. The upper and lower limits of voltage source 202 may be different between embodiments, e.g., based on the characteristics of circuit 200, amplifier 300, and/or device 350. The adjusting in process P2 may be implemented after testing the power ramping profile of amplifier 300, or may include adjusting input voltage $V_{IN}$ to meet a specification voltage before operating circuit 200 and/or device 350.

Methods according to the disclosure may proceed from process P1 or process P2 to process P3 of transmitting the output from amplifier 202 to cells 212, which share the same substrate 120. Cells 212 may be provided in the form of power cell chain 214 as discussed elsewhere herein. In process P3 includes transmitting the output voltage from error amplifier 202. The output voltage from error amplifier 202 is an amplified voltage proportionate to the difference between: input voltage $V_{IN}$, and a reference voltage produced from reference current $I_{REF}$ multiplied by the resistance across cells 212. Methods according to the disclosure use the output from error amplifier 202 to automatically adjust the resistance across cells 212. Adjusting the resistance across cells 212 will change the value of reference current $I_{REF}$ and automatically modify the output voltage from error amplifier 202. Process P3 thus includes applying the output voltage from error amplifier 202 to cells 212 to continuously adjust the output voltage from error amplifier 202. This electrical behavior may create a closed electrical feedback loop without active control elements, as noted elsewhere herein.

The output voltage from amplifier 202 may adjust properties of amplifier 300 concurrently with adjusting the voltage drop across cells 212. In process P4, the method includes applying the output voltage from error amplifier 202 to one or more back-gate terminals of respective amplifier transistors 302 in amplifier 300. In various embodiments, amplifier transistors 302 may be formed in an additional FDSOI substrate. In still further embodiments, amplifier 300 may be an RF amplifier such as in the example of FIG. 4. Applying the output voltage from error amplifier 202 to the back-gate terminal of amplifier transistor(s) 302 will affect the source-drain resistance between the input and output of amplifier 300, thereby stabilizing amplifier 300 as the device undergoes power ramping. The method may then re-implement processes P1-P4 as the back-gate voltage is applied to amplifier 300 to provide continuous closed-loop control of amplifier 300. In other cases, the method may conclude ("Done") after amplifier 300 ceases operating. When the method concludes, device 350 may resume operating in a non-transient state where power ramping is not required. In some implementations, an optional process P5 of the disclosure may include disabling voltage source 204 when device 350 begins operating in a non-transient state. Disabling voltage source 204 (e.g., by switching off a connection between a power supply and voltage source 200) may cause error amplifier 202 to have a zero voltage at both terminals, and thus may produce an output voltage of zero. The method may then conclude ("Done") until device 350 begins operating in a transient state again.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure comprising:
   an error amplifier having: an input terminal coupled to a voltage source, a reference terminal, and an output terminal coupled to a back-gate terminal of a power amplifier, wherein the voltage source has a selected voltage level, and a voltage at the output terminal of the error amplifier indicates a voltage difference between the input terminal and the reference terminal;
   a logarithmic current source coupled to the reference terminal of the error amplifier, wherein the logarithmic current source generates a reference current that is logarithmically dependent on the selected voltage level of the voltage source; and
   a plurality of serially coupled transistor cells having a shared substrate and coupled between the reference terminal of the error amplifier and ground, wherein each of the serially coupled transistor cells includes a back-gate terminal coupled to the output terminal of the error amplifier.

2. The circuit structure of claim 1, wherein the shared substrate comprises a fully-depleted semiconductor-on-insulator (FDSOI) substrate.

3. The circuit structure of claim 2, wherein the output terminal of the error amplifier is coupled to a plurality of back-gate terminals of a differential radio frequency (RF) amplifier, the plurality of back-gate terminals of the RF amplifier being formed within an additional FDSOI substrate from the shared substrate.

4. The circuit structure of claim 1, wherein the voltage level of the voltage source is adjustable within a linear voltage profile, and wherein the logarithmic current source is adjustable within a logarithmic current profile.

5. The circuit structure of claim 4, wherein a range of the linear voltage profile is between approximately −3.0 volts (V) and approximately 4.0 V, and wherein a range of the logarithmic current profile is between approximately ten microamperes (μA) and approximately five milliamperes (mA).

6. The circuit structure of claim 1, wherein the selected voltage level of the voltage source is equal to a voltage supplied to the power amplifier, such that the error amplifier, the logarithmic current source, and the plurality of serially coupled transistor cells define a closed loop to continuously adjust an internal resistance of the power amplifier between input and output terminals thereof.

7. The circuit structure of claim 1, wherein the logarithmic current source includes a logarithmic digital to analog converter (DAC) having an output terminal coupled to the reference terminal of the error amplifier, and the plurality of serially coupled transistor cells.

8. A circuit structure comprising:
an error amplifier having: an input terminal coupled to a voltage source, a reference terminal, and an output terminal coupled to a back-gate terminal of a power amplifier, wherein a voltage at the output terminal of the error amplifier indicates a voltage difference between the input terminal and the reference terminal;
a logarithmic current source having an output coupled to the reference terminal of the error amplifier, wherein the logarithmic current is configured to generate a reference current logarithmically proportionate to a voltage level of the voltage source; and
a power cell chain having an input terminal coupled to the reference terminal of the error amplifier and the output from the logarithmic current source, and an output terminal coupled to ground, the power cell chain including:
a dopant-implanted substrate, the dopant-implanted substrate defining a back-gate region, the back-gate region being coupled to the output terminal of the error amplifier;
a buried insulator layer positioned on the dopant-implanted substrate,
a fully-depleted semiconductor-on-insulator (FDSOI) substrate positioned on the buried insulator layer, wherein the buried insulator layer separates the FDSOI layer from the back-gate region, and
a plurality of serially-connected transistors each formed within the FDSOI layer and each including a source region, a channel region, and a drain region, and a gate region electrically coupled to the source region.

9. The circuit structure of claim 8, wherein the output terminal of the error amplifier is coupled to a plurality of back-gate terminals within a differential radio frequency (RF) amplifier, the plurality of back-gate terminals of the RF amplifier being formed within an additional FDSOI substrate from the shared substrate.

10. The circuit structure of claim 8, wherein the voltage level of the voltage source is adjustable within a linear voltage profile, and wherein the logarithmic current source is adjustable within a logarithmic current profile.

11. The circuit structure of claim 10, wherein a range of the linear voltage profile is between approximately −3.0 volts (V) and approximately 4.0 V, and wherein a range of the logarithmic current profile is between approximately ten microamperes (µA) and approximately five milliamperes (mA).

12. The circuit structure of claim 8, wherein a voltage level of the voltage source is equal to a voltage supplied to the power amplifier, such that the error amplifier, the logarithmic current source, and the power cell chain define a closed loop continuously adjust an internal resistance of the power amplifier between input and output terminals thereof.

13. The circuit structure of claim 8, wherein the logarithmic current source includes a logarithmic digital to analog converter (DAC) having an output terminal coupled to the reference terminal of the error amplifier, and the input terminal of the power cell chain.

14. A method comprising:
transmitting a reference current to a reference terminal of an error amplifier, the reference current being logarithmically proportionate to an input voltage of a voltage source coupled to an input terminal of the error amplifier, the voltage source having a selected voltage level, wherein the logarithmic current is logarithmically dependent on the selected voltage level of the voltage source;
transmitting an output from the error amplifier to a plurality of serially coupled transistor cells at respective back-gate terminals thereof, the plurality of serially coupled transistor cells receiving the reference current to define a voltage at the reference terminal of the error amplifier; and
applying the output to a back-gate terminal of an amplifier transistor during the transmitting of the reference current and the output from the error amplifier, to continuously adjust an internal resistance of the power amplifier between input and output terminals thereof.

15. The method of claim 14, wherein transmitting the output voltage from the error amplifier to the plurality of serially coupled transistor cells includes biasing a shared fully depleted semiconductor on insulator (FDSOI) substrate of the plurality of serially coupled transistor cells to the output voltage.

16. The method of claim 14, further comprising operating the power amplifier in a transient state during the transmitting of the reference current, the transmitting of the output voltage, and the biasing of the back-gate terminal of the amplifier transistor.

17. The method of claim 16, further comprising disabling the voltage source in response to the circuit not operating in the transient state.

18. The method of claim 16, wherein operating the power amplifier in the transient state includes switching a radio frequency (RF) amplifier, coupled to the output of the error amplifier, between a dormant operating mode and an active operating mode.

19. The method of claim 14, further comprising adjusting the selected voltage level of the voltage source across a linear voltage profile to yield a corresponding adjustment of the reference current across a logarithmic current profile.

20. The method of claim 19, wherein a range of the linear voltage profile is between approximately −3.0 volts (V) and approximately 4.0 V, and wherein a range of the logarithmic current profile is between approximately ten microamperes (µA) and approximately five milliamperes (mA).

* * * * *